United States Patent
Lee et al.

(10) Patent No.: US 10,541,376 B2
(45) Date of Patent: Jan. 21, 2020

(54) ORGANIC SOLAR CELL AND MANUFACTURING METHOD THEREFOR

(71) Applicant: LG CHEM, LTD., Seoul (KR)

(72) Inventors: Hangken Lee, Daejeon (KR); Songrim Jang, Daejeon (KR); Jaechol Lee, Daejeon (KR); Jiyoung Lee, Daejeon (KR); Doowhan Choi, Daejeon (KR); Jiwon Bang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 384 days.

(21) Appl. No.: 15/307,346

(22) PCT Filed: Apr. 28, 2015

(86) PCT No.: PCT/KR2015/004263
§ 371 (c)(1),
(2) Date: Oct. 27, 2016

(87) PCT Pub. No.: WO2015/167225
PCT Pub. Date: Nov. 5, 2015

(65) Prior Publication Data
US 2017/0062745 A1    Mar. 2, 2017

(30) Foreign Application Priority Data

Apr. 29, 2014    (KR) .......... 10-2014-0051511

(51) Int. Cl.
*H01L 51/42*    (2006.01)
(52) U.S. Cl.
CPC .............. *H01L 51/4273* (2013.01)

(58) Field of Classification Search
CPC .............. H01L 51/4213; H01L 51/0049; H01L 51/4273
See application file for complete search history.

(56) References Cited

U.S. PATENT DOCUMENTS

| 9,079,837 | B2 | 7/2015 | Chung et al. | |
|---|---|---|---|---|
| 2009/0266416 | A1* | 10/2009 | Tolbert | B82Y 10/00 136/256 |
| 2012/0018715 | A1* | 1/2012 | Moon | C08G 61/123 257/40 |
| 2013/0160827 | A1* | 6/2013 | Jen | H01L 31/02167 136/252 |
| 2013/0247993 | A1* | 9/2013 | Gong | H01L 51/426 136/263 |

(Continued)

FOREIGN PATENT DOCUMENTS

| JP | 2011-053482 A | 3/2011 |
|---|---|---|
| KR | 10-2011-0120224 A | 11/2011 |

(Continued)

OTHER PUBLICATIONS

Choi Hyosung et al: "Acid-functionalized fullerenes used as interfacial layer materials in inverted polymer solar cells", *Organic Electronics*, 14, 2013, p. 3138-3145.

(Continued)

*Primary Examiner* — Niki Bakhtiari
(74) *Attorney, Agent, or Firm* — Myers Bigel, P.A.

(57) ABSTRACT

The present specification relates to an organic solar cell and a method for manufacturing the same.

20 Claims, 2 Drawing Sheets

(56) References Cited

U.S. PATENT DOCUMENTS

| | | | |
|---|---|---|---|
| 2013/0306943 A1* | 11/2013 | Kato | C09J 139/06 257/40 |
| 2013/0327376 A1* | 12/2013 | Bulliard | H01L 51/0049 136/252 |
| 2014/0319404 A1 | 10/2014 | Levin et al. | |

FOREIGN PATENT DOCUMENTS

| | | |
|---|---|---|
| KR | 10-2012-0054154 A | 5/2012 |
| KR | 10-2012-0119414 A | 10/2012 |
| KR | 10-2014-0042829 A | 4/2014 |
| WO | WO 2011/160021 | 12/2011 |

OTHER PUBLICATIONS

Search Report corresponding to European Patent Application No. 15786174.1, dated Nov. 17, 2017.

* cited by examiner

[Figure 1]
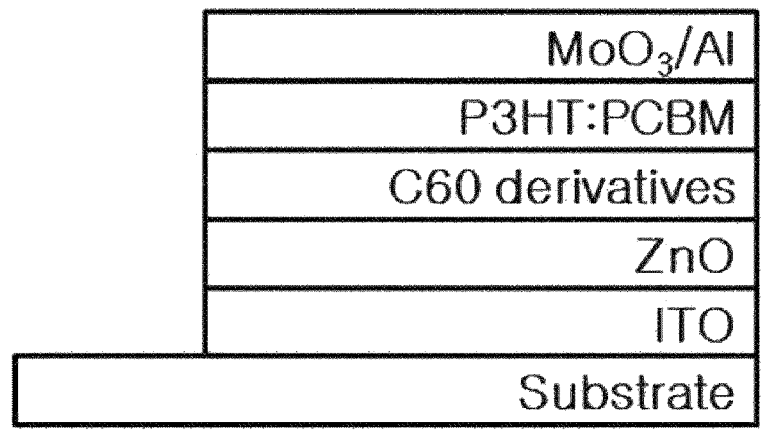
[Figure 2]
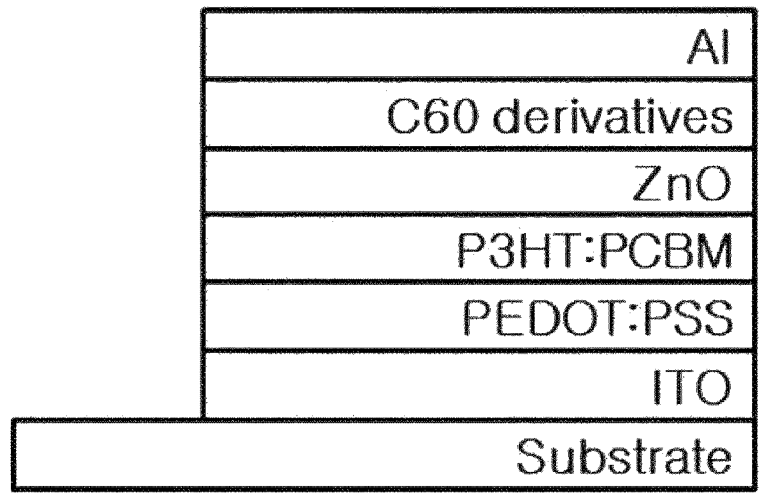

[Figure 3]
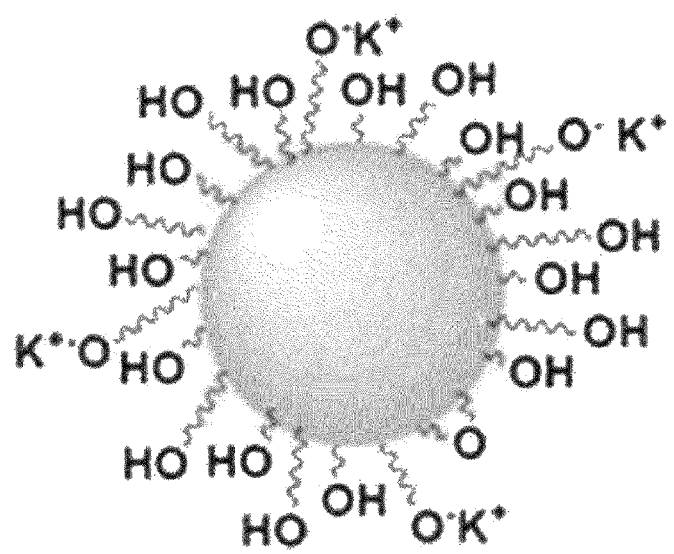

ORGANIC SOLAR CELL AND MANUFACTURING METHOD THEREFOR

TECHNICAL FIELD

This application is a National Stage Application of International Application No. PCT/KR2015/004263, filed on Apr. 28, 2015, and claims the benefit of Korean Patent Application No. 10-2014-0051511, filed on Apr. 29, 2014, the contents of which are incorporated herein by reference in their entirety for all purposes as if fully set forth below.

The present specification relates to an organic solar cell and manufacturing method therefor.

BACKGROUND ART

According to an energy review material by a US National Laboratory NREL, the energy sources, which are currently and mainly used, are petroleum, coal, and gas. These energy sources amount to 80% of the energy source which is totally used. However, the current depletion state of petroleum and coal energy is gradually becoming a big problem, and emissions of increasing carbon dioxide and other greenhouse gases into the atmosphere have been generating severe problems. In contrast, the use of renewable energy which is non-polluting green energy is only about 2% of the total energy source. Thus, worries about solving the problems of the energy source have become a motivational reason for promoting studies to develop new renewable energy. Among the new renewable energy sources such as wind, water, and the sun, solar energy is drawing the most attention. Solar cells using solar energy produce less pollution, are limitless in terms of resources, have a semi-permanent lifetime, and thus are expected as an energy source capable of solving the future energy problems.

A solar cell is a device which may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as the ratio of electric power given to an external circuit and solar power entering the solar cell, and the efficiency have reached approximately 24% when measured under a currently standardized virtual solar irradiation condition. However, since inorganic solar cells in the related art have already shown the limitation in economic feasibility and material demands and supplies, an organic solar cell, which is easily processed and inexpensive and has various functionalities, has come into the spotlight as a long-term alternative energy source.

For the early organic solar cell, the group led by Professor Heeger at UCSB in the US initiatively led the development of technology. The organic solar cell has an advantage in that monomolecular organic materials or polymer materials used easily and quickly enable an inexpensive and large area process.

However, according to the studies, which have been conducted to date, the organic solar cell has a disadvantage in that the energy conversion efficiency is low. Therefore, in order to secure the competitiveness with other solar cells at this point, it can be said that an improvement in efficiency is very important.

CITATION LIST

Two-Layer Organic Photovoltaic Cell (C. W. Tang, Appl. Phys. Lett., 48, 183. (1996))

Efficiencies via Network of Internal Donor-Acceptor Heterojunctions (G. Yu, J. Gao, J. C. Hummelen, F. Wudl, A. J. Heeger, Science, 270, 1789. (1995))

DETAILED DESCRIPTION OF THE INVENTION

Technical Problem

The present specification has been made in an effort to provide an organic solar cell and a method for manufacturing the same.

Technical Solution

An exemplary embodiment of the present specification provides an organic solar cell including: a first electrode; a second electrode provided to face the first electrode; and two or more organic material layers including a photoactive layer and a fullerene layer provided between the first electrode and the second electrode, in which the fullerene layer includes one or more fullerene derivatives, a ratio of a hydrophilic substituent and a hydrophobic substituent which are bonded to the fullerene derivative is 1:0 to 1:0.9, and the hydrophilic substituent includes one or more selected from the group consisting of a hydroxy group, an indene group, a thiol group, a ketone group, a sulfonyl group, an amine group, an amino group, a phosphoric acid group, an ammonium group, and an ether group.

An exemplary embodiment of the present specification provides a method for manufacturing an organic solar cell, the method including: preparing a substrate; forming a first electrode on the substrate; forming two or more organic material layers, which includes a photoactive layer and a fullerene layer, on the first electrode; and forming a second electrode on the organic material layer, in which the fullerene layer includes one or more fullerene derivatives, a ratio of a hydrophilic substituent and a hydrophobic substituent which are bonded to the fullerene derivative is 1:0 to 1:0.9, and the hydrophilic substituent includes one or more selected from the group consisting of a hydroxy group, an indene group, a thiol group, a ketone group, a sulfonyl group, an amine group, an amino group, a phosphoric acid group, an ammonium group, and an ether group.

Advantageous Effects

An organic solar cell according to an exemplary embodiment of the present specification has an excellent electron transfer capacity and thus may implement an increase in photo short-circuit current density (Jsc) and an increase in efficiency.

Further, the organic solar cell according to an exemplary embodiment of the present specification may improve a fill factor and thus may implement high efficiency.

In addition, the organic solar cell according to an exemplary embodiment of the present specification may reduce production costs and/or increase the efficiency of processes, due to a simple manufacturing process.

BRIEF DESCRIPTION OF DRAWINGS

FIG. 1 illustrates an example of an organic solar cell according to an exemplary embodiment of the present specification.

FIG. 2 illustrates an example of an organic solar cell according to an exemplary embodiment of the present specification.

FIG. 3 illustrates a schematic view of a fullerene derivative used in Examples.

BEST MODE

Hereinafter, the present specification will be described in more detail.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

An exemplary embodiment of the present specification provides an organic solar cell including: a first electrode; a second electrode provided to face the first electrode; and two or more organic material layers including a photoactive layer and a fullerene layer provided between the first electrode and the second electrode, in which the fullerene layer includes one or more fullerene derivatives, a ratio of a hydrophilic substituent and a hydrophobic substituent which are bonded to the fullerene derivative is 1:0 to 1:0.9, and the hydrophilic substituent includes one or more selected from the group consisting of a hydroxy group, an indene group, a thiol group, ketone group, a sulfonyl group, an amine group, an amino group, a phosphoric acid group, an ammonium group, and an ether group.

According to an exemplary embodiment of the present specification, the ratio of the hydrophilic substituent and the hydrophobic substituent which are bonded to the fullerene derivative may be 1:0.01 to 1:0.5.

According to an exemplary embodiment of the present specification, the ratio of the hydrophilic substituent and the hydrophobic substituent which are bonded to the fullerene derivative may be 1:0.01 to 1:0.1.

According to an exemplary embodiment of the present specification, the ratio of the hydrophilic substituent and the hydrophobic substituent which are bonded to the fullerene derivative may be 1:0.01 to 1:0.07.

According to an exemplary embodiment of the present specification, the ratio of the hydrophilic substituent and the hydrophobic substituent which are bonded to the fullerene derivative may be 1:0.03 to 1:0.067.

According to an exemplary embodiment of the present specification, the ratio of the hydrophilic substituent and the hydrophobic substituent may mean a molar ratio. Further, according to an exemplary embodiment of the present specification, the ratio of the hydrophilic substituent and the hydrophobic substituent may mean a ratio of the numbers of hydrophilic substituents and hydrophobic substituents.

According to an exemplary embodiment of the present specification, the fullerene derivative may be further bonded to one or more selected from the group consisting of an alkali metal ion and an alkaline earth metal ion.

The alkali metal ion and/or the alkaline earth metal ion may increase the polydispersity of the fullerene derivative in an aqueous solvent. Further, the alkali metal ion and/or the alkaline earth metal ion may improve the charge moving capacity of the fullerene layer by forming a local dipole at an interface between other layers which is brought into contact with the fullerene layer.

According to an exemplary embodiment of the present specification, the hydrophilic substituent may be in a form where an additional substituent is bonded to the hydrophilic substituent.

Further, according to an exemplary embodiment of the present specification, the hydrophilic substituent may include one or more selected from the group consisting of a hydroxy group, an indene group, a thiol group, a ketone group, a sulfonyl group, an amine group, an amino group, a phosphoric acid group, an ammonium group, and an ether group at the terminal thereof.

According to an exemplary embodiment of the present specification, the hydrophobic substituent may include one or more selected from the group consisting of a substituted or unsubstituted C1 to C30 alkyl group, a substituted or unsubstituted C3 to C30 cycloalkyl group, a substituted or unsubstituted C6 to C30 aryl group, a substituted or unsubstituted C2 to C30 heteroaryl group, a halogen group, a C1 to C30 ester group, and a halogen-containing group.

According to an exemplary embodiment of the present specification, the fullerene derivative may include a fullerene having 60 to 100 carbon atoms. Specifically, according to an exemplary embodiment of the present specification, the fullerene derivative may include a fullerene having 60, 70, or 90 carbon atoms, and more specifically, may include a fullerene having 60 carbon atoms.

According to an exemplary embodiment of the present specification, the alkali metal ion may be Na+, K+, or Rb+.

According to an exemplary embodiment of the present specification, the alkaline earth metal ion may be Mg2+, Ca2+, or Sr2+.

According to an exemplary embodiment of the present specification, the fullerene derivative may be a fullerene derivative in which the size of a hydrodynamic radius in an aqueous solvent is a size of 2 orders or less of the fullerene derivative single molecule.

According to an exemplary embodiment of the present specification, the fullerene derivative may be a fullerene derivative in which the size of a hydrodynamic radius in an aqueous solvent is a size of 1 order or less of the fullerene derivative single molecule.

The hydrodynamic radius may be a measure which indicates the dispersibility in a solvent. Specifically, the hydrodynamic radius may be a measure capable of judging the degree of aggregation of particles in a solvent, and means that the smaller the order value of the hydrodynamic radius is, the higher the dispersibility in a solvent is.

For the fullerene derivative of the present specification, the size of the hydrodynamic radius in an aqueous solvent is a size of 2 orders or less or 1 order or less of the fullerene derivative single molecule, and the dispersibility in an aqueous solvent is very high.

According to an exemplary embodiment of the present specification, the fullerene derivative may be a fullerene derivative which is easily dispersed in an aqueous solvent. Specifically, the fullerene derivative has characteristics in that the fullerene derivative is easily dispersed in a solvent such as water and alcohols by a hydrophilic substituent.

According to an exemplary embodiment of the present specification, the fullerene derivative has low dispersibility in an organic solvent and thus has an advantage in that when an organic material layer is formed on the fullerene layer by using an organic solvent, the fullerene layer may minimize damage caused by the organic solvent. Specifically, according to an exemplary embodiment of the present specification, a photoactive layer may be provided on the fullerene layer, and the photoactive layer is formed by using an organic solvent. In this case, when the photoactive layer is formed, the fullerene layer may minimize damage caused by an organic solvent.

According to an exemplary embodiment of the present specification, the fullerene derivative may be bonded to 1 to 70 hydrophilic substituents.

According to an exemplary embodiment of the present specification, the fullerene derivative may be bonded to 3 to 50 hydroxy groups and 0 to 30 alkali metal ions and/or alkaline earth metal ions.

According to an exemplary embodiment of the present specification, the fullerene derivative may be bonded to 20 to 30 hydroxy groups and 1 to 5 K+s.

According to an exemplary embodiment of the present specification, the content of the fullerene derivative may be 0.01 wt % to 100 wt % with respect to the total mass of the fullerene layer.

According to an exemplary embodiment of the present specification, the fullerene layer does not include a metal oxide, and the content of the fullerene derivative may be 50 wt % to 100 wt % with respect to the total mass of the fullerene layer. Specifically, according to an exemplary embodiment of the present specification, the fullerene layer does not include a metal oxide, and the content of the fullerene derivative may be 80 wt % to 100 wt % with respect to the total mass of the fullerene layer.

According to an exemplary embodiment of the present specification, the fullerene layer further includes a metal oxide, and the content of the fullerene derivative may be 0.01 wt % to 50 wt % with respect to the total mass of the fullerene layer. Specifically, according to an exemplary embodiment of the present specification, the fullerene layer further includes a metal oxide, and the content of the fullerene derivative may be 0.01 wt % to 30 wt % with respect to the total mass of the fullerene layer. In this case, the fullerene layer may be a fullerene layer in which the fullerene derivative is dispersed in a matrix including the metal oxide.

When the content of the fullerene derivative of the fullerene layer is within the range, it is possible to suppress the recombination of electrons and holes and implement an improvement in current density of the organic solar cell. When the content of the fullerene derivative is less than the range, there is a disadvantage in that it is difficult to prevent recombination of electrons and holes.

According to an exemplary embodiment of the present specification, the fullerene layer may have a thickness of 1 nm to 50 nm.

Specifically, according to an exemplary embodiment of the present specification, when the fullerene layer does not include a metal oxide, the fullerene layer may have a thickness of 1 nm to 20 nm. Or, when the fullerene layer does not include a metal oxide, the fullerene layer may have a thickness of 1 nm to 10 nm, or 1 nm to 8 nm.

According to an exemplary embodiment of the present specification, the fullerene layer may have a thickness which is 1 to 5 times of the molecular particle diameter of the fullerene derivative.

Specifically, according to an exemplary embodiment of the present specification, when the fullerene layer includes a metal oxide, the fullerene layer may have a thickness of 5 nm to 50 nm. Or, when the fullerene layer includes a metal oxide, the fullerene layer may have a thickness of 10 nm to 35 nm, or 20 nm to 30 nm.

When the thickness of the fullerene layer is within the range, the current density due to the light absorption by fullerene may be increased. Further, when a photoactive layer is provided on a fullerene layer having the thickness, the degree of molecular arrangement of the photoactive layer is improved, thereby enhancing light absorption and charge moving characteristics. When the thickness of the fullerene layer exceeds 50 nm, charge transport characteristics may deteriorate, and charge traps due to the aggregation of the fullerene derivative are generated, thereby decreasing the fill factor.

According to an exemplary embodiment of the present specification, the organic solar cell further includes a buffer layer provided between the first electrode and the photoactive layer or between the second electrode and the photoactive layer, and the buffer layer may include a metal oxide.

According to an exemplary embodiment of the present specification, the buffer layer may be provided to be brought into contact with the fullerene layer.

According to an exemplary embodiment of the present specification, the buffer layer may serve as an electron transport layer.

According to an exemplary embodiment of the present specification, the fullerene layer is provided to be brought into contact with the buffer layer and thus may serve to facilitate the charge movement between the photoactive layer and the buffer layer.

According to an exemplary embodiment of the present specification, the fullerene layer may serve to facilitate the charge movement between the buffer layer and a cathode.

According to an exemplary embodiment of the present specification, the fullerene layer may lower a charge injection barrier by adjusting the work function of an adjacent layer and thus may improve charge selectivity and current density.

According to an exemplary embodiment of the present specification, the fullerene layer may be provided to be adjacent to the photoactive layer, and in this case, the fullerene layer may serve as an electron acceptor to prevent the recombination of excited electrons and thus may increase the efficiency of the organic solar cell.

According to an exemplary embodiment of the present specification, the metal oxide included in the buffer layer may include one or more selected from the group consisting of $ZnO$; $TiO_2$; $TiOx$; $ZrO_2$; $Ta_2O_3$; $Cs_2CO_3$; $MgO$; $HfO_2$; $WO_3$; and ZnO doped with Al or Ga.

According to an exemplary embodiment of the present specification, the fullerene layer and the buffer layer may be physically bonded to each other.

The present inventors have found that the buffer layer is an inorganic material layer, the fullerene layer is an organic material layer, and adhesion characteristics of the interface need to be improved due to different physical properties. In order to solve the problem, the present inventors dispersed a fullerene derivative substituted with a hydrophilic substituent in a solvent of water and/or an alcohol to form a fullerene layer on a buffer layer including a metal oxide. The present inventors have revealed that when a fullerene layer is formed as described above, the buffer layer and the fullerene layer are physically adsorbed rather than being chemically bonded (anchored), and the energy barrier at the interface between the buffer layer and the fullerene layer is lowered. Further, according to an exemplary embodiment of the present specification, there is an advantage in that a post-treatment process such as a heat treatment for chemically bonding the fullerene layer and the buffer layer need not be carried out. Further, since an organic solvent is not used in order to form the fullerene layer, it is possible to minimize damage to the fullerene layer caused by the organic solvent when a layer is formed on the fullerene layer by using the organic solvent.

According to an exemplary embodiment of the present specification, the buffer layer may have a thickness of 1 nm to 100 nm. Specifically, according to an exemplary embodiment of the present specification, the buffer layer may have a thickness of 15 nm to 30 nm.

The present inventors have found that in a solar cell having an inverted structure in which the direction of transporting charges is reversed by using a buffer layer including a metal oxide, recombination of electrons and holes occurs due to the difference in interface characteristics between the buffer layer and the photoactive layer, and as a result, the efficiency of the organic solar cell deteriorates. Thus, the present inventors have revealed that when the fullerene layer is provided between a metal oxide layer and a photoactive layer, charge moving characteristics are improved, electrons and holes are prevented from recombining with each other, and as a result, the efficiency of the organic solar cell is improved. Furthermore, the present inventors have found that when the fullerene layer is provided between the adjacent two layers, charge moving characteristics between the adjacent two layers are improved.

According to an exemplary embodiment of the present specification, the fullerene layer may be provided between the photoactive layer and the buffer layer. In this case, the organic solar cell may have an inverted structure.

In addition, according to an exemplary embodiment of the present specification, the fullerene layer may be provided between the second electrode and the buffer layer. In this case, the organic solar cell may have a normal structure.

According to an exemplary embodiment of the present specification, the organic solar cell has an inverted structure in which a substrate is further provided, the first electrode is provided on the substrate, the first electrode is a cathode, and the second electrode is an anode, and the buffer layer may be provided between the first electrode and the photoactive layer, and the fullerene layer may be provided between the buffer layer and the photoactive layer.

The Inverted structure may mean that a cathode is formed on a substrate. Specifically, according to an exemplary embodiment of the present specification, when the organic solar cell has an inverted structure, a first electrode to be formed on a substrate may be a cathode.

FIG. 1 illustrates an example of an organic solar cell according to an exemplary embodiment of the present specification. Specifically, FIG. 1 illustrates an organic solar cell having an inverted structure according to an exemplary embodiment of the present specification. In FIG. 1, ITO is provided as a cathode on a substrate, a buffer layer is formed on the cathode by using ZnO, a fullerene layer is formed by using a C60 fullerene derivative, P3HT:PCBM is used as a photoactive layer, and MoO3/Al is formed as an anode. However, the organic solar cell according to an exemplary embodiment of the present specification is not limited to the structure and material in FIG. 1, an additional layer may be provided, and each layer may be constituted by using various materials.

According to an exemplary embodiment of the present specification, the organic solar cell has a normal structure in which a substrate is further provided, the first electrode is provided on the substrate, the first electrode is an anode, and the second electrode is a cathode, and the metal oxide layer may be provided between the photoactive layer and the second electrode, and the fullerene layer may be provided between the metal oxide layer and the second electrode.

The normal structure may mean that an anode is formed on a substrate. Specifically, according to an exemplary embodiment of the present specification, when the organic solar cell has a normal structure, a first electrode to be formed on a substrate may be an anode.

FIG. 2 illustrates an example of an organic solar cell according to an exemplary embodiment of the present specification. Specifically, FIG. 2 illustrates an organic solar cell having a normal structure according to an exemplary embodiment of the present specification. In FIG. 2, ITO is provided as an anode on a substrate, a PEDOT:PSS layer is formed as a buffer layer on the anode, P3HT:PCBM is used as a photoactive layer, a metal oxide layer is formed on the photoactive layer by using ZnO, a fullerene layer is formed by using a C60 fullerene derivative, and a cathode is formed by using Al.

However, the organic solar cell according to an exemplary embodiment of the present specification is not limited to the structure and material in FIG. 2, an additional layer may be provided, and each layer may be constituted by using various materials.

According to an exemplary embodiment of the present specification, the fullerene layer may further include a metal oxide.

According to an exemplary embodiment of the present specification, the fullerene layer may be a fullerene layer in which the fullerene derivative is included in a matrix including a metal oxide. Specifically, according to an exemplary embodiment of the present specification, the fullerene layer may be a fullerene layer in which the fullerene derivative is dispersed in a matrix including a metal oxide.

According to an exemplary embodiment of the present specification, the fullerene is characterized by being easily dispersed in an aqueous solvent, and as a result, a solution including a material which forms the metal oxide layer is formed, and then the fullerene layer may be formed as one layer without forming a separate metal oxide layer.

When the fullerene layer includes a metal oxide, the fullerene derivative may allow the metal oxide to be negatively charged, and as a result, the ability of the fullerene layer to transport charges may be enhanced. Furthermore, recombination may be prevented on the surface of the fullerene layer to improve the current density and the fill factor.

Further, according to an exemplary embodiment of the present specification, when the fullerene layer includes a metal oxide, an additional buffer layer may not be included. That is, according to an exemplary embodiment of the present specification, when the fullerene layer includes a metal oxide, the fullerene layer may be provided to be brought into contact with an electrode and thus may serve as an electrode buffer layer.

When the fullerene layer includes a metal oxide, the fullerene derivative acts as an n-type dopant in a metal oxide structural body to lower the LUMO level of the fullerene layer and increase the degree of bulk charge transport, thereby increasing the current density and the fill factor. Furthermore, the fullerene layer may be formed by using a mixed solution including the fullerene derivative and the metal oxide, the fullerene layer is formed by a process simpler than when a separate buffer layer is formed, it is possible to use a larger thickness than when a fullerene layer including only a fullerene derivative is used, and as a result, the fullerene layer is more suitable for a roll-to-roll mass production process.

According to an exemplary embodiment of the present specification, the metal oxide included in the fullerene layer may include one or more selected from the group consisting of ZnO; TiO$_2$; TiOx; ZrO$_2$; Ta$_2$O$_3$; Cs$_2$CO$_3$; MgO; HfO$_2$; WO$_3$; and ZnO doped with Al or Ga.

According to an exemplary embodiment of the present specification, the organic solar cell has an inverted structure in which a substrate is further provided, the first electrode is provided on the substrate, the first electrode is a cathode, and the second electrode is an anode, and the fullerene layer may be provided between the photoactive layer and the first electrode.

According to an exemplary embodiment of the present specification, the organic solar cell has a normal structure in which a substrate is further provided, the first electrode is provided on the substrate, the first electrode is an anode, and the second electrode is a cathode, and the fullerene layer may be provided between the photoactive layer and the second electrode.

According to an exemplary embodiment of the present specification, the organic solar cell may further include a substrate. Specifically, the substrate may be provided at the lower portion of the first electrode.

According to an exemplary embodiment of the present specification, as the substrate, it is possible to use a substrate having excellent transparency, surface smoothness, ease of handling, and water-proof property. Specifically, a glass substrate, a thin film glass substrate, or a transparent plastic substrate may be used. The plastic substrate may include a film such as polyethylene terephthalate (PET), polyethylene naphthalate (PEN), polyether ether ketone (PEEK), and polyimide (PI) in the form of a single layer or multi-layers. However, the substrate is not limited thereto, and a substrate typically used for an organic solar cell may be used.

According to an exemplary embodiment of the present specification, the first electrode may be an anode, and the second electrode may be a cathode. Further, the first electrode may be a cathode, and the second electrode may be an anode.

According to an exemplary embodiment of the present specification, the first electrode may be a transparent electrode.

When the first electrode is a transparent electrode, the first electrode may be a conductive oxide, such as indium tin oxide (ITO) or indium zinc oxide (IZO). Furthermore, the first electrode may also be a semi-transparent electrode. When the first electrode is a semi-transparent electrode, the first electrode may be prepared by using a semi-transparent metal such as Ag, Au, Mg, Ca, or an alloy thereof. When a semi-transparent metal is used as a first electrode, the organic solar cell may have a micro cavity structure.

When the electrode of the present specification is a transparent conductive oxide layer, as the electrode, it is possible to use an electrode in which a conductive material is doped onto a flexible and transparent material such as plastic including polyethylene terephthalate (PET), polyethylene naphthalate (PEN), polypropylene (PP), polyimide (PI), polycarbonate (PC), polystyrene (PS), polyoxymethylene (POM), an acrylonitrile styrene copolymer (AS resin), an acrylonitrile butadiene styrene copolymer (ABS resin), triacetyl cellulose (TAC), polyarylate (PAR), and the like, in addition to glass and a quartz plate. Specifically, the electrode may be indium tin oxide (ITO), fluorine doped tin oxide (FTO), aluminum doped zinc oxide (AZO), indium zinc oxide (IZO), ZnO—Ga$_2$O$_3$, ZnO—Al$_2$O$_3$, antimony tin oxide (ATO), and the like, and more specifically, the electrode may be ITO.

In an exemplary embodiment of the present specification, in the forming of the transparent electrode, a patterned ITO substrate is sequentially cleaned with a cleaner, acetone, and isopropanol (IPA), and then dried on a hot plate at 100° C. to 250° C. for 1 minute to 30 minutes, specifically at 250° C. for 10 minutes, in order to remove moisture, and when the substrate is completely cleaned, the surface of the substrate may be hydrophilically modified. As a pre-treatment technology for this purpose, it is possible to use a) a surface oxidation method using a parallel flat plate-type discharge, b) a method of oxidizing the surface through ozone produced by using UV rays in a vacuum state, c) an oxidation method using oxygen radicals produced by plasma, and the like. The junction surface potential may be maintained through a surface modification as described above at a level suitable for the surface potential of the hole injection layer, the polymer thin film is easily formed on an ITO substrate, and the quality of the thin film may be improved. Depending on the condition of the substrate, one of the methods is selected, and whatever method is used, a substantial effect of the pre-treatment may be commonly expected only when oxygen is prevented from leaving from the surface of the substrate and moisture and organic materials are maximally inhibited from remaining.

In the Examples of the present specification described below, the method of oxidizing the surface through ozone produced by using UV was used, and after ultrasonic cleaning, the patterned ITO substrate was baked and dried well on a hot plate, introduced into the next chamber, and a UV lamp was actuated to clean the patterned ITO substrate by ozone produced by reacting oxygen gas with UV light. However, the method of modifying the surface of the patterned ITO substrate in the present invention need not be particularly limited, and any method may be used as long as the method is a method of oxidizing a substrate.

According to an exemplary embodiment of the present specification, the second electrode may be a metal electrode. Specifically, the metal electrode may include one or two or more selected from the group consisting of silver (Ag), aluminum (Al), platinum (Pt), tungsten (W), copper (Cu), molybdenum (Mo), gold (Au), nickel (Ni), and palladium (Pd).

According to an exemplary embodiment of the present specification, the organic solar cell may have an inverted structure. When the organic solar cell according to an exemplary embodiment of the present specification has an inverted structure, the second electrode may be silver (Ag) or MoO$_3$/Al.

The organic solar cell having an inverted structure according to the present specification many mean that an anode and a cathode of an organic solar cell having a general structure are configured in a reverse direction. An Al layer used in an organic solar cell having a general structure is very vulnerable to an oxidation reaction in the air, has difficulty in being used as an ink, and thus has a limitation in commercialization through a printing process. However, since Ag may be used instead of Al, the organic solar cell having the inverted structure according to the present specification is more stable to the oxidation reaction than an organic solar cell having a general structure and facilitates the preparation of an Ag ink, and accordingly, there is an advantage in that the organic solar cell is advantageous in commercialization through a printing process.

According to an exemplary embodiment of the present specification, the organic solar cell may have a normal structure. When the organic solar cell according to an exemplary embodiment of the present specification has a normal structure, the second electrode may be Al.

According to an exemplary embodiment of the present specification, the organic material layer may further include one or more layers selected from the group consisting of a hole injection layer, a hole transport layer, an electron blocking layer, an electron transport layer, and an electron injection layer.

In an exemplary embodiment of the present specification, the electron transport layer may include one or two or more selected from the group consisting of conductive oxides and metals.

According to an exemplary embodiment of the present specification, a conductive oxide of the electron transport layer may be electron-extracting metal oxides, and specifically, may include one or more selected from the group consisting of titanium oxides ($TiO_x$); zinc oxide (ZnO); and cesium carbonate ($Cs_2CO_3$).

The electron transport layer may be formed by using sputtering, E-Beam, thermal deposition, spin coating, screen printing, inkjet printing, doctor blade, or a gravure printing method to apply the conductive oxide on one surface of a first electrode or coat the conductive oxide in the form of a film.

According to an exemplary embodiment of the present specification, the electron transport layer may be a cathode buffer layer.

In an exemplary embodiment of the present specification, the photoactive layer includes an electron donor material and an electron acceptor material as a photoactive material. In the present specification, the photoactive material may mean the electron donor material and the electron acceptor material.

In the photoactive layer, the electron donor material forms an exciton in which an electron and a hole form a pair by photoexcitation, and the exciton is separated into an electron and a hole at the interface of electron donor/electron acceptor. The separated electron and hole move to the electron donor material and the electron acceptor material, respectively, and the electron and hole may be collected in the first electrode and the second electrode to be used outside as an electric energy.

Further, in an exemplary embodiment of the present specification, the photoactive layer may have a bulk heterojunction structure or a double layer junction structure. The bulk heterojunction structure may be a bulk heterojunction (BHJ) junction type, and the double layer junction structure may be a bi-layer junction type.

In an exemplary embodiment of the present specification, a mass ratio of the electron donor material and the electron acceptor material may be 1:10 to 10:1. Specifically, the mass ratio of the electron acceptor material and the electron donor material in the present specification may be 1:0.5 to 1:5.

According to an exemplary embodiment of the present specification, the electron donor material may include: at least one electron donor; or a polymer of at least one electron acceptor and at least one electron donor. The electron donor material may include at least one electron donor. In addition, the electron donor material includes a polymer of at least one electron acceptor and at least one electron donor.

Specifically, the electron donor material may be various polymer materials and monomolecular materials, such as thiophene-based, fluorene-based, and carbazole-based compounds, starting from poly[2-methoxy-5-(2'-ethyl-hexyloxy)-1,4-phenylene vinylene] (MEH-PPV).

Specifically, the monomolecular material may include one or more materials selected from the group consisting of copper(II) phthalocyanine, zinc phthalocyanine, tris[4-(5-dicyanomethylidenemethyl-2-thienyl)phenyl]amine, 2,4-bis[4-(N,N-dibenzylamino)-2,6-dihydroxyphenyl]squaraine, benz[b]anthracene, and pentacene.

Specifically, the polymer material may include one or more materials selected from the group consisting of poly 3-hexyl thiophene (P3HT), poly[N-9'-heptadecanyl-2,7-carbazole-alt-5,5-(4'-7'-di-2-thienyl-2',1',3'-benzothiadiazole)] (PCDTBT), poly[2,6-(4,4-bis-(2-ethylhexyl)-4H-cyclopenta [2,1-b;3,4-b']dithiophene)-alt-4,7-(2,1,3-benzothiadiazole)] (PCPDTBT), poly[2,7-(9,9-dioctyl-fluorene)-alt-5,5-(4,7-di 2-thienyl-2,1,3-benzothiadiazole)] (PFO-DBT), poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), and poly[2,7-(9,9-dioctyl-dibenzosilole)-alt-4,7-bis(thiophen-2-yl)benzo-2,1,3-thiadiazole] (PSiF-DBT).

In an exemplary embodiment of the present specification, the electron acceptor material may be a fullerene derivative or a non-fullerene derivative.

In an exemplary embodiment of the present specification, the fullerene derivative is a C60 to C90 fullerene derivative. Specifically, the fullerene derivative may be a C60 fullerene derivative or a C70 fullerene derivative.

According to an exemplary embodiment of the present specification, the C60 fullerene derivative or the C70 fullerene derivative is each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group including one or more of N, O, and S atoms, or two adjacent substituents may be additionally substituted with a substituent which forms a fused ring.

In an exemplary embodiment of the present specification, the fullerene derivative may be selected from the group consisting of a C76 fullerene derivative, a C78 fullerene derivative, a C84 fullerene derivative, and a C90 fullerene derivative.

According to an exemplary embodiment of the present specification, the C76 fullerene derivative, the C78 fullerene derivative, the C84 fullerene derivative, and the C90 fullerene derivative may be each independently selected from the group consisting of hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group including one or more of N, O, and S atoms, or two adjacent substituents may be additionally substituted with a substituent which forms a fused ring.

The fullerene derivate is excellent in ability to separate an electron-hole pair (exciton) and charge mobility compared to the non-fullerene derivative and thus is advantageous in efficiency characteristics.

In the photoactive layer according to an exemplary embodiment of the present specification, an electron donor material and an electron acceptor material may form a bulk heterojunction (BHJ). The photoactive layer of the present specification may be annealed at 30° C. to 300° C. for 1 second to 24 hours in order to maximize the characteristics after the electron donor material and the electron acceptor material are mixed with each other.

In an exemplary embodiment of the present specification, the photoactive layer may include poly 3-hexyl thiophene (P3HT) as an electron donor material and [6,6]-phenyl-$C_{61}$-butyric acid methyl ester ($PC_{61}BM$) and/or [6,6]-phenyl-$C_{71}$-butyric acid methyl ester ($PC_{71}BM$) as an electron acceptor material.

In an exemplary embodiment of the present specification, a mass ratio of the electron donor material and the electron acceptor material may be 1:0.4 to 1:2, and specifically 1:0.7. However, the photoactive layer is not limited to only the materials.

The photoactive materials as described above are dissolved in an organic solvent, and then the solution is applied by a method such as spin coating to introduce a photoactive layer having a thickness in a range of 50 nm to 280 nm. In this case, it is possible to apply a method, such as dip coating, screen printing, spray coating, doctor blade, and brush painting, to the photoactive layer.

Further, the electron acceptor may also use other fullerene derivatives including PC61BM, such as C70, C76, C78, C80, C82, and C84, and the coated thin film may be subjected to heat treatment at 80° C. to 160° C. to enhance the crystallinity of the conductive polymer. Specifically, the organic solar cell of the present specification has an inverted structure, and in this case, a pre-annealing may be carried out at 120° C.

The hole transport layer material and/or the electron transport layer material of the present specification may be a material which increases the probability that charges produced move to an electrode by efficiently transferring electrons and holes to the photoactive layer, but are/is not limited thereto.

According to an exemplary embodiment of the present specification, the hole transport layer may be an anode buffer layer.

The hole transport layer may be introduced into the upper portion of the pre-treated photoactive layer by a method such as spin coating, dip coating, inkjet printing, gravure printing, spray coating, doctor blade, bar coating, gravure coating, brush painting, and thermal deposition. In this case, poly(3,5-ethylenedioxythiophene):poly(4-styrenesulfonate) [PEDOT:PSS] is usually used as the conductive polymer solution, and it is possible to use molybdenum oxide ($MoO_x$), vanadium oxide ($V_2O_5$), nickel oxide (NiO), tungsten oxide ($WO_x$), and the like as the hole-extracting metal oxide material. According to an exemplary embodiment of the present specification, the hole transport layer may be formed by depositing $MoO_3$ to have a thickness of 5 nm to 10 nm through a thermal deposition system.

According to an exemplary embodiment of the present specification, the organic solar cell may have a wound structure. Specifically, the organic solar cell may be manufactured in the form of a flexible film, and may be made as a solar cell having a hollow wound structure by rolling the flexible film into a cylindrical form. When the organic solar cell has a wound structure, it is possible to install the organic solar cell in a way in which the organic solar cell is erected on the ground. In this case, while the sun moves from the east to the west at a position where the organic solar cell is installed, it is possible to secure a portion in which the incident angle of light becomes the maximum value. Accordingly, while the sun is up in the sky, there is a benefit in that light may be absorbed as much as possible to increase the efficiency.

An exemplary embodiment of the present specification provides a method for manufacturing an organic solar cell, the method including: preparing a substrate; forming a first electrode on the substrate; forming two or more organic material layers including two or more organic material layers, which includes a photoactive layer and a fullerene layer, on the first electrode; and forming a second electrode on the organic material layer, in which the fullerene layer includes one or more fullerene derivatives, a ratio of a hydrophilic substituent and a hydrophobic substituent which are bonded to the fullerene derivative is 1:0 to 1:0.9, and the hydrophilic substituent includes one or more selected from the group consisting of a hydroxy group, an indene group, a thiol group, ketone group, a sulfonyl group, an amine group, an amino group, a phosphoric acid group, an ammonium group, and an ether group.

According to an exemplary embodiment of the present specification, the fullerene layer may be formed by using a fullerene solution including the fullerene derivative and an aqueous solvent.

In an exemplary embodiment of the present specification, the aqueous solvent may be water or a C1 to 10 alcohol-based solvent.

According to an exemplary embodiment of the present specification, the content of the fullerene derivative may be 0.01 wt % to 1 wt % with respect to the total weight of the fullerene solution. Specifically, the content of the fullerene derivative may be 0.1 wt % to 0.5 wt % with respect to the total mass of the fullerene solution. More specifically, the content of the fullerene derivative may be 0.1 wt % to 0.25 wt % with respect to the total mass of the fullerene solution.

According to an exemplary embodiment of the present specification, the fullerene solution may further include a metal oxide.

The metal oxide is the same as the above-described metal oxide.

According to an exemplary embodiment of the present specification, when a fullerene solution including the metal oxide is prepared, and then a fullerene layer is formed, the fullerene layer may be formed as one layer without forming a separate metal oxide layer.

Since the fullerene is characterized by being easily dispersed in an aqueous solvent, a solution may be formed together with the metal oxide, and as a result, there is an advantage in that one layer including fullerene and a metal oxide may be manufactured through a solution process as described above.

According to an exemplary embodiment of the present specification, the method for manufacturing an organic solar cell further includes forming a metal oxide layer, and the fullerene layer may be formed on the metal oxide layer.

According to an exemplary embodiment of the present specification, the forming of the organic material layer may include forming the fullerene layer by using an aqueous solvent, and forming a photoactive layer on the fullerene layer by using the aqueous solvent and an organic solvent having a relative energy difference (RED) value of 1 or more. Since the fullerene derivative has low dispersibility in an organic solvent, there is an advantage in that damage caused by an organic solvent scarcely occurs.

The present inventors have found a disadvantage in that in the case of a chemical bond in which fullerene, which is an organic material, is attached (anchored) on an inorganic material layer such as a metal oxide layer, a heat treatment process for impregnation of the inorganic material layer into a fullerene solution for a long period of time and a chemical bond and a washing process for removing extra fullerene are additionally needed.

In order to overcome the aforementioned process drawbacks, the present inventors have developed a method for directly forming a fullerene layer on an inorganic material layer without impregnation and washing processes by using a fullerene derivative easily dispersed in an aqueous solvent. In this case, the present inventors have revealed that the inorganic material layer and the fullerene layer are physically adsorbed on each other, and as a result, the movement of electrons at the interface is facilitated and adhesive strength at the interface is also excellent compared to the case where the organic material layer and the fullerene layer are chemically bonded to each other.

According to an exemplary embodiment of the present specification, when a fullerene derivative which is easily dispersed in an aqueous solvent as described above is used, the fullerene solution may be directly applied on a buffer layer including a metal oxide to form a fullerene layer.

Specifically, according to an exemplary embodiment of the present specification, the fullerene layer may be formed by using a spin coating method, a deposition method, or a printing method.

The printing method may include inkjet printing, gravure printing, spray coating, doctor blading, bar coating, gravure coating, brush painting, bar coating, slot-die coating, and the like. However, the printing method is not limited thereto.

When a fullerene layer is formed as described above, there is an advantage in that process costs and process time may be reduced because a separate post-treatment process is not needed.

MODE FOR INVENTION

Hereinafter, the present specification will be explained in detail with reference to Examples for specifically explaining the present specification. However, the Examples according to the present specification may be modified in various forms, and it is not interpreted that the scope of the present specification is limited to the Examples described below in detail. The Examples of the present specification are provided for more completely explaining the present specification to the person with ordinary skill in the art.

EXAMPLE 1

An ITO glass was used as a first electrode, and ZnO was used to form a buffer layer having a thickness of 22 nm on the first electrode. A fullerene solution was prepared by adding a fullerene derivative of FI-06-3 (manufactured by MTR Inc.) to distilled water in a content of 0.25 wt % with respect to the total weight of distilled water. The fullerene solution was applied by a spin coating method to form a fullerene layer on the buffer layer. During the spin coating, the spin coater was rotated at 1,000 rpm, and the fullerene layer had a thickness of 6 nm. On the fullerene layer, a photoactive layer was formed of P3HT:$PC_{60}BM$. $MoO_3$ was used to form a buffer layer on the photoactive layer, and then a second electrode was formed of Ag on the buffer layer to manufacture an organic solar cell having an inverted structure. The physical properties of the organic solar cell according to Example 1 are shown in the following Table 1.

EXAMPLE 2

An ITO glass was used as a first electrode, and ZnO was used to form a buffer layer having a thickness of 22 nm on the first electrode. A fullerene solution was prepared by adding a fullerene derivative of FI-06-3 (manufactured by MTR Inc.) to distilled water in a content of 0.25 wt % with respect to the total weight of distilled water. The fullerene solution was applied by a spin coating method to form a fullerene layer on the buffer layer. During the spin coating, the spin coater was rotated at 2,000 rpm, and the fullerene layer had a thickness of 4 nm. On the fullerene layer, a photoactive layer was formed of P3HT:$PC_{60}BM$. $MoO_3$ was used to form a buffer layer on the photoactive layer, and then a second electrode was formed of Ag on the buffer layer to manufacture an organic solar cell having an inverted structure. The physical properties of the organic solar cell according to Example 2 are shown in the following Table 1.

EXAMPLE 3

An ITO glass was used as a first electrode, and ZnO was used to form a buffer layer having a thickness of 22 nm on the first electrode. A fullerene solution was prepared by adding a fullerene derivative of FI-06-3 (manufactured by MTR Inc.) to distilled water in a content of 0.125 wt % with respect to the total weight of distilled water. The fullerene solution was applied by a spin coating method to form a fullerene layer on the buffer layer. During the spin coating, the spin coater was rotated at 1,000 rpm, and the fullerene layer had a thickness of 2 nm. On the fullerene layer, a photoactive layer was formed of P3HT:$PC_{60}BM$. $MoO_3$ was used to form a buffer layer on the photoactive layer, and then a second electrode was formed of Ag on the buffer layer to manufacture an organic solar cell having an inverted structure. The physical properties of the organic solar cell according to Example 3 are shown in the following Table 1.

EXAMPLE 4

An ITO glass was used as a first electrode, and ZnO was used to form a buffer layer having a thickness of 22 nm on the first electrode. A fullerene solution was prepared by adding a fullerene derivative of FI-06-3 (manufactured by MTR Inc.) to distilled water in a content of 0.125 wt % with respect to the total weight of distilled water. The fullerene solution was applied by a spin coating method to form a fullerene layer on the buffer layer. During the spin coating, the spin coater was rotated at 2,000 rpm, and the fullerene layer had a thickness of 1 nm. On the fullerene layer, a photoactive layer was formed of P3HT:$PC_{60}BM$. $MoO_3$ was used to form a buffer layer on the photoactive layer, and then a second electrode was formed of Ag on the buffer layer to manufacture an organic solar cell having an inverted structure. The physical properties of the organic solar cell according to Example 4 are shown in the following Table 1.

EXAMPLE 5

A fullerene solution was prepared by mixing a fullerene derivative of FI-06-3 (manufactured by MTR Inc.) in a content of 0.5 wt % with respect to the total weight of ZnO particles with a solution in which ZnO nanoparticles were dispersed. The fullerene solution was applied by a spin coating method to form a fullerene layer on an ITO glass. During the spin coating, the spin coater was rotated at 1,000 rpm, and the fullerene layer had a thickness of 22 nm. On the fullerene layer, a photoactive layer was formed of P3HT:$PC_{60}BM$. $MoO_3$ was used to form a buffer layer on the photoactive layer, and then a second electrode was formed of Ag on the buffer layer to manufacture an organic solar cell having an inverted structure. The physical properties of the organic solar cell according to Example 5 are shown in the following Table 1.

COMPARATIVE EXAMPLE 1

An organic solar cell was manufactured in the same manner as in Example 1, except for the fullerene layer. The physical properties of the organic solar cell according to Comparative Example 1 are shown in the following Table 1.

TABLE 1

| | Thickness of Fullerene Layer (nm) | $J_{sc}$ (mA/cm$^2$) | $V_{oc}$ (V) | FF | PCE (%) |
|---|---|---|---|---|---|
| Comparative Example 1 | — | 0.614 | 10.49 | 0.515 | 3.31 |
| Example 1 | 6 | 0.618 | 11.16 | 0.538 | 3.71 |
| Example 2 | 4 | 0.618 | 11.50 | 0.537 | 3.81 |
| Example 3 | 2 | 0.614 | 11.55 | 0.551 | 3.9 |
| Example 4 | 1 | 0.616 | 11.23 | 0.556 | 3.84 |
| Example 5 | 22 | 0.617 | 11.30 | 0.591 | 4.12 |

EXAMPLE 6

An ITO glass was used as a first electrode, and PEDOT:PSS was used to form a buffer layer on the first electrode. On the PEDOT:PSS, a photoactive layer was formed of P3HT:$PC_{60}BM$. Moreover, a fullerene solution was prepared by mixing a fullerene derivative of FI-06-3 (manufactured by MTR Inc.) in a content of 0.5 wt % with respect to the total weight of ZnO particles with a solution in which ZnO nanoparticles were dispersed. Thereafter, the fullerene solution was applied by a spin coating method to form a fullerene layer having a thickness of 25 nm on the photoactive layer. A second electrode was formed of Al on the fullerene layer to manufacture an organic solar cell having a normal structure. The physical properties of the organic solar cell according to Example 6 are shown in the following Table 2.

COMPARATIVE EXAMPLE 2

An organic solar cell was manufactured in the same manner as in Example 6, except that only ZnO was used to form a fullerene layer. The physical properties of the organic solar cell according to Comparative Example 2 are shown in the following Table 2.

TABLE 2

| | $J_{sc}$ (mA/cm$^2$) | $V_{oc}$ (V) | FF | PCE (%) |
|---|---|---|---|---|
| Comparative Example 2 | 0.620 | 10.23 | 0.580 | 3.68 |
| Example 6 | 0.624 | 11.16 | 0.602 | 4.19 |

FIG. 3 illustrates a schematic view of a fullerene derivative used in the Examples. In FIG. 3, the sphere means a fullerene, and shows that —OH and —O—K+ are bonded onto the fullerene surface.

In the present specification, $V_{oc}$, $J_{sc}$, FF, and PCE mean an open-circuit voltage, a current density or a short-circuit current, a fill factor, and am energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open circuit voltage. The energy conversion efficiency may be obtained when these three values are divided by the intensity of the irradiated light, and the higher value is preferred.

When the physical properties of the organic solar cells according to the Comparative Examples and the Examples in Tables 1 and 2 are compared with each other, it can be seen that the organic solar cells in the Examples in which the fullerene layer is provided between a buffer layer and a photoactive layer exhibit higher fill factor and efficiency than those in the Comparative Examples in which the fullerene layer is not provided therebetween.

COMPARATIVE EXAMPLE 3

A fullerene solution was prepared by adding a comparative structural body including a —COOH group as in the following structural formula to distilled water in a content of 0.125 wt % with respect to the total weight of distilled water. An ITO glass was used as a first electrode, ZnO was used to form a buffer layer having a thickness of 22 nm on the first electrode, and then the first electrode was impregnated into the fullerene solution for 2 hours, and then was washed with methanol in order to remove extra fullerene derivative which had not been bonded, thereby forming a fullerene layer having a thickness of 2 nm. On the fullerene layer, a photoactive layer was formed of P3HT:$PC_{60}BM$. $MoO_3$ was used to form a buffer layer on the photoactive layer, and then a second electrode was formed of Ag on the buffer layer to manufacture an organic solar cell having an inverted structure. The physical properties of the organic solar cell according to Comparative Example 3 are shown in the following Table 3.

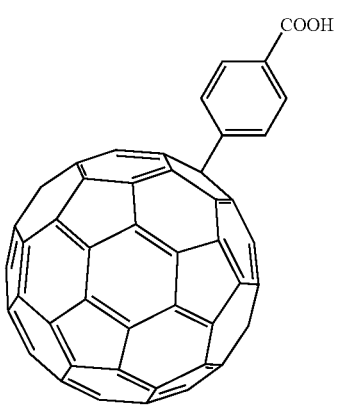

[Comparative Structural Body]

COMPARATIVE EXAMPLE 4

An organic solar cell having an inverted structure was manufactured in the same manner as in Comparative Example 3, except that the fullerene layer was formed by using a spin coating method instead of the impregnation method. The physical properties of the organic solar cell according to Comparative Example 4 are shown in the following Table 3.

TABLE 3

|  | $J_{sc}$ (mA/cm$^2$) | $V_{oc}$ (V) | FF | PCE (%) |
|---|---|---|---|---|
| Comparative Example 3 | 0.620 | 11.34 | 0.560 | 3.94 |
| Comparative Example 4 | 0.610 | 10.45 | 0.520 | 3.31 |
| Example 3 | 0.614 | 11.55 | 0.551 | 3.9 |

In the case of Comparative Example 3, when a chemical bond of the buffer layer and the fullerene layer is induced through the impregnation method, there occur problems such as peeling between ITO/ZnO layers and deterioration in ZnO bulk characteristics because the ZnO layer needs to be impregnated into the fullerene solution layer for a long period of time even though the performances of the organic solar cells manufactured are similar to each other. Furthermore, process times and process steps in which washing needs to be performed in an alcohol solvent are additionally needed in order to remove extra fullerene derivative materials, and accordingly, there is also a problem of an increase in costs when a module is produced through a continuous process.

Further, in the case of Comparative Example 4, it can be seen that if a fullerene derivative substituted with —COOH as in the comparative structural body is induced to have a physical bond instead of a chemical bond, the efficiency significantly deteriorates, and the effects of the fullerene layer are not exhibited.

In contrast, the organic solar cells according to the Examples have an advantage in that a physical bond is induced between the fullerene layer and the buffer layer through spin coating, and an organic solar cell with high efficiency can be quickly and simply manufactured.

The invention claimed is:

1. An organic solar cell comprising:
 a first electrode;
 a second electrode facing the first electrode;
 two or more organic material layers comprising a photoactive layer and a fullerene layer between the first electrode and the second electrode; and
 a buffer layer that is between the first electrode and the photoactive layer or between the second electrode and the photoactive layer;
 wherein the fullerene layer comprises a fullerene derivative,
 a ratio of a hydrophilic substituent and a hydrophobic substituent which are bonded to the fullerene derivative is 1:0.01 to 1:0.5,
 the hydrophilic substituent comprises one or more selected from the group consisting of a hydroxy group, an indene group, a thiol group, a ketone group, a sulfonyl group, an amine group, an amino group, a phosphoric acid group, an ammonium group, and an ether group,
 the fullerene derivative is further bonded to one or more selected from the group consisting of an alkali metal ion and an alkaline earth metal ion, and
 the fullerene derivative is bonded to 3 to 50 hydroxy groups and 1 to 30 alkali metal ions or alkaline earth metal ions;
 wherein the buffer layer is physically bonded to and contacts the fullerene layer; and
 wherein the buffer layer comprises a first metal oxide.

2. The organic solar cell of claim 1, wherein for the fullerene derivative, a size of a hydrodynamic radius in an aqueous solvent is a size of 2 orders or less of the fullerene derivative single molecule.

3. The organic solar cell of claim 1, wherein 3 to 70 hydrophilic substituents are bonded to the fullerene derivative.

4. The organic solar cell of claim 1, wherein the fullerene layer has a thickness of 1 nm to 50 nm.

5. The organic solar cell of claim 1, wherein a content of the fullerene derivative is 0.01 wt % to 100 wt % based on a total mass of the fullerene layer.

6. The organic solar cell of claim 1, wherein the organic solar cell further comprises a substrate, the first electrode is provided on the substrate,
 the organic solar cell has an inverted structure in which the first electrode is a cathode and the second electrode is an anode,
 the buffer layer is provided between the first electrode and the photoactive layer, and
 the fullerene layer is provided between the buffer layer and the photoactive layer.

7. The organic solar cell of claim 1, wherein the organic solar cell further comprises a substrate, the first electrode is provided on the substrate,
 the organic solar cell has a normal structure in which the first electrode is an anode and the second electrode is a cathode,
 the buffer layer is provided between the photoactive layer and the second electrode, and
 the fullerene layer is provided between the buffer layer and the second electrode.

8. The organic solar cell of claim 1, wherein the fullerene layer is a matrix comprising a second metal oxide, and the fullerene derivative is dispersed in the matrix.

9. The organic solar cell of claim 8, wherein the organic solar cell further comprises a substrate, the first electrode is provided on the substrate, the organic solar cell has an inverted structure in which the first electrode is a cathode and the second electrode is an anode, and the fullerene layer is provided between the photoactive layer and the first electrode.

10. The organic solar cell of claim 8, wherein the organic solar cell further comprises a substrate, the first electrode is provided on the substrate, the organic solar cell has a normal structure in which the first electrode is an anode and the second electrode is a cathode, and the fullerene layer is provided between the photoactive layer and the second electrode.

11. A method for manufacturing an organic solar cell, the method comprising:

providing a substrate;

forming a first electrode on the substrate;

forming two or more organic material layers on the first electrode, the two or more organic material layers comprising a photoactive layer and a fullerene layer;

forming a second electrode on the two or more organic material layers; and forming a buffer layer comprising a first metal oxide before forming the fullerene layer, wherein the fullerene layer is physically bonded to the buffer layer, wherein the fullerene layer comprises a fullerene derivative, a ratio of a hydrophilic substituent and a hydrophobic substituent which are bonded to the fullerene derivative is 1:0.01 to 1:0.5, the hydrophilic substituent comprises one or more selected from the group consisting of a hydroxy group, an indene group, a thiol group, a ketone group, a sulfonyl group, an amine group, an amino group, a phosphoric acid group, an ammonium group, and an ether group, the fullerene derivative is further bonded to one or more selected from the group consisting of an alkali metal ion and an alkaline earth metal ion, and the fullerene derivative is bonded to 3 to 50 hydroxy groups and 1 to 30 alkali metal ions or alkaline earth metal ions.

12. The method of claim 11, wherein the fullerene layer is formed by using a fullerene solution comprising the fullerene derivative and an aqueous solvent.

13. The method of claim 12, wherein the aqueous solvent is water or a $C_{1-10}$ alcohol-based solvent.

14. The method of claim 12, wherein a content of the fullerene derivative is 0.01 wt % to 1 wt % based on a total weight of the fullerene solution.

15. The method of claim 11, wherein forming the two or more organic material layers comprises forming the fullerene layer by using an aqueous solvent and forming the photoactive layer on the fullerene layer by using the aqueous solvent and an organic solvent.

16. The method of claim 12, wherein the fullerene solution further comprises a second metal oxide.

17. An organic solar cell comprising:

a first electrode;

a second electrode facing the first electrode;

a plurality of organic material layers comprising a photoactive layer and a fullerene layer between the first electrode and the second electrode; and a buffer layer that is physically bonded to and contacts the fullerene layer, wherein the fullerene layer comprises a fullerene derivative, wherein a ratio of a hydrophilic substituent and a hydrophobic substituent which are bonded to the fullerene derivative is 1:0.01 to 1:0.5, wherein the hydrophilic substituent comprises one or more selected from the group consisting of a hydroxy group, an indene group, a thiol group, a ketone group, a sulfonyl group, an amine group, an amino group, a phosphoric acid group, and an ammonium group, wherein the fullerene derivative is bonded to 3 to 50 hydroxy groups and 1 to 30 alkali metal ions or alkaline earth metal ions, and wherein the buffer layer comprises a metal oxide.

18. The organic solar cell of claim 17, wherein the fullerene derivative is bonded to 20 to 50 hydroxy groups.

19. The organic solar cell of claim 1, wherein the ratio of the hydrophilic substituent and the hydrophobic substituent which are bonded to the fullerene derivative is 1:0.01 to 1:0.1.

20. The organic solar cell of claim 1, wherein the buffer layer has a thickness of 1 nm to 100 nm.

* * * * *